US006901009B2

United States Patent
Natori

(10) Patent No.: US 6,901,009 B2
(45) Date of Patent: May 31, 2005

(54) BOOSTER CIRCUIT FOR NON-VOLATILE SEMICONDUCTOR MEMORY DEVICE

(75) Inventor: Kanji Natori, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/338,834

(22) Filed: Jan. 9, 2003

(65) Prior Publication Data

US 2003/0151070 A1 Aug. 14, 2003

(30) Foreign Application Priority Data

Jan. 23, 2002 (JP) ........................................ 2002-014281

(51) Int. Cl.[7] .............................................. G11C 16/04
(52) U.S. Cl. ............................ 365/185.18; 365/185.21; 365/189.11
(58) Field of Search ....................... 365/185.18, 185.21, 365/189.11, 189.09, 233, 233.5

(56) References Cited

U.S. PATENT DOCUMENTS

| 5,408,115 | A | | 4/1995 | Chang |
| 5,422,504 | A | | 6/1995 | Chang et al. |
| 5,494,838 | A | | 2/1996 | Chang et al. |
| 5,563,824 | A | * | 10/1996 | Miyawaki et al. ..... 365/185.18 |
| 5,969,383 | A | | 10/1999 | Chang et al. |
| 6,177,318 | B1 | | 1/2001 | Ogura et al. |
| 6,248,633 | B1 | | 6/2001 | Ogura et al. |
| 6,255,166 | B1 | | 7/2001 | Ogura et al. |

FOREIGN PATENT DOCUMENTS

| JP | A 7-161851 | 6/1995 |
| JP | B1 2978477 | 9/1999 |
| JP | A 2001-156188 | 6/2001 |

OTHER PUBLICATIONS

U.S. patent application Ser. No. 09/955,158, Kanai et al., filed Sep. 19, 2001.
U.S. patent application Ser. No. 09/955,160, Kanai et al., filed Sep. 19, 2001.
U.S. patent application Ser. No. 10/115,913, Kamei, filed Apr. 5, 2002.
U.S. patent application Ser. No. 10/115,956, Kamei, filed Apr. 5, 2002.
U.S. patent application Ser. No. 10/153,611, Owa, filed May 24, 2002.
U.S. patent application Ser. No. 10/153,686, Owa, filed May 24, 2002.
U.S. patent application Ser. No. 10/153,736, Owa, filed May 24, 2002.
U.S. patent application Ser. No. 10/157,896, Kamei et al., filed May 31, 2002.
U.S. patent application Ser. No. 10/157,897, Kamei et al., filed May 31, 2002.
U.S. patent application Ser. No. 10/193,066, Kanai, filed Jul. 12, 2002.

(Continued)

*Primary Examiner*—David Lam
(74) *Attorney, Agent, or Firm*—Oliff & Berridge, PLC

(57) ABSTRACT

A detection circuit detects a rising time period between a power supply ON time or a reset time and a time when a boosted voltage reaches a standby voltage, and outputs a detection signal representing a result of the detection. An oscillation circuit generates an outputs a clock signal having a constant frequency which is lower than a frequency in an ordinary state, while the detection signal is at a high level. A charge pump circuit boosts a power source voltage in response to the input clock signal of the constant frequency and causes the boosted voltage to gently rise from the power source voltage, thereby effectively interfering with an increase in reference voltage accompanied by the increase in boosted voltage.

15 Claims, 9 Drawing Sheets

OTHER PUBLICATIONS

U.S. patent application Ser. No. 10/193,602, Kanai, filed Jul. 12, 2002.
U.S. patent application Ser. No. 10/197,643, Kanai et al., filed Jul. 18, 2002.
U.S. patent application Ser. No. 10/197,644, Kamei, filed Jul. 18, 2002.
U.S. patent application Ser. No. 10/197,645, Natori, filed Jul. 18, 2002.
U.S. patent application Ser. No. 10/197,646, Kanai, filed Jul. 18, 2002.
U.S. patent application Ser. No. 10/197,668, Kanai, filed Jul. 18, 2002.
U.S. patent application Ser. No. 10/229,064, Kamei, filed Aug. 28, 2002.
U.S. patent application Ser. No. 10/246,486, Natori, filed Sep. 19, 2002.
U.S. patent application Ser. No. 10/246,665, Natori, filed Sep. 19, 2002.
U.S. patent application Ser. No. 10/246,708, Natori, filed Sep. 19, 2002.
U.S. patent application Ser. No. 10/246,727, Natori, filed Sep. 19, 2002.
U.S. patent application Ser. No. 10/323,921, Natori, filed Dec. 20, 2002.

Hayashi et al., "Twin MONOS Cell with Dual Control Gates", 2000 IEEE VLSI Technology Digest of Technical Papers.

Chang et al., "A New SONOS Memory Using Source–Side Injection for Programming", IEEE Electron Device Letters, vol. 19, No. 7, Jul. 1998, pp. 253–255.

Chen et al., "A Novel Flash Memory Device with S Plit Gate Source Side Injection and ONO Charge Storage Stack (SPIN)", 1997, VLSI Technology Digest, pp. 63–64.

* cited by examiner

BOOSTER CIRCUIT FOR NON-VOLATILE SEMICONDUCTOR MEMORY DEVICE

BACKGROUND OF THE INVENTION

1. Field of the Invention

The present invention relates to a voltage generation circuit for a non-volatile semiconductor memory device. More specifically the invention pertains to a booster circuit that generates a boosted voltage from a power source voltage according to an operation mode.

2. Description of the Related Art

A semiconductor memory device has a memory cell array, in which multiple memory cells are arranged in a matrix. Data reading, programming or writing, and erasing operations with regard to each memory cell are generally carried out by specifying an address in a row direction and a column direction of the memory cell array.

Regulation of a voltage applied to a signal line in the row direction and to a signal line in the column direction connected to each memory cell enables an access to the memory cell, in order to carry out a predetermined operation out of the data reading, programming, and erasing operations. For selection of a certain memory cell, a specific voltage, which is different from a voltage applied to the other memory cells, is generated from a power source voltage and is applied to the certain memory cell.

Recently developed MONOS (Metal Oxide Nitride Oxide Semiconductor or Substrate)-type non-volatile semiconductor memory devices are non-volatile and enable electrical erasing of data. In the MONOS-type non-volatile semiconductor memory device, each memory cell has two memory elements as discussed in a reference Y. Hayashi, et al., 2000 Symposium on VLSI Technology Digest of Technical Papers, pp. 122–123.

As described in this cited reference, in order to gain access to the respective memory elements in such a MONOS-type non-volatile semiconductor memory device, it is required to set, as control voltages, a plurality of different voltages corresponding to the respective signal lines (control lines), which depend upon the number of the memory cells. Different control voltages are also required corresponding to respective operation modes (reading, programming, erasing, and standby modes) with regard to each memory element.

A voltage generation circuit generates such a control voltage. The voltage generation circuit typically includes a booster circuit that boosts the power source voltage according to each of diverse operation modes, and a control voltage generation circuit that receives the boosted voltage and generates a plurality of different control voltages required for the respective operation modes.

FIG. 8 shows the structure of a prior art booster circuit 260. The booster circuit 260 includes an oscillation circuit 300 that carries out an oscillating operation and outputs a clock signal OSCK, a charge pump circuit 310 that boosts a power source voltage Vdd in response to the clock signal OSCK and outputs a boosted voltage HV, and a level sense circuit 320 that controls the oscillating operation of the oscillation circuit 300 to make the boosted voltage HV equal to a predetermined setting voltage according to each of the operation modes.

The control logic shown in FIG. 8 represents a circuit that generates and outputs control signals to a diversity of circuits including the booster circuit 260.

The booster circuit 260 shown in FIG. 8 boosts one power source voltage Vdd to a plurality of different voltages. The booster circuit 260 boosts the power source voltage Vdd of, for example, 1.8 V to a high voltage of 8.0 V and outputs the high voltage of 8.0 V as the boosted voltage HV in a Program (data writing) mode and in an Erase (data erasing) mode, while boosting the power source voltage Vdd to a low voltage of 5.0 V and outputs the low voltage of 5.0 V as the boosted voltage HV in a Read (data reading) mode and in a Standby mode. The Standby mode represents a standby state without any access to the memory element for data reading, data writing, or data erasing. The boosted voltage of 5.0 V in the Standby mode may hereafter be referred to as the standby voltage.

The oscillation circuit 300 outputs the clock signal OSCK, which to be supplied to the charge pump circuit 310, in response to an enable signal ENB from the level sense circuit 320. The oscillation circuit 300 stops the oscillating operation when the enable signal ENB is at a low level (in an inactive state), while starting the oscillating operation when the enable signal ENB is at a high level (in an active state).

The charge pump circuit 310 boosts the power source voltage Vdd in response to the clock signal OSCK supplied from the oscillation circuit 300 and outputs the boosted voltage HV. The charge pump circuit 310 should have a sufficient current capacity to enable the generated voltage to be supplied to a subsequent loading (for example, a memory cell array) in the active operation modes, that is, in the Read mode, in the Program mode, and in the Erase mode.

The level sense circuit 320 determines whether the output voltage (the boosted voltage) HV from the charge pump circuit 310 is higher or lower than the low voltage of 5.0 V in the Standby mode and in the Read mode and is higher or lower than the high voltage of 8.0 V in the Program mode and in the Erase mode, in response to a read signal RD, a programming signal PGM, an erasing signal ERS, and a standby signal STB supplied from the control logic. The level sense circuit 320 then feeds back a detection signal ACT representing the result of the determination as the enable signal ENB to the oscillation circuit 300.

The level sense circuit 320 has a comparator 322. A reference voltage Vrf is input into a negative input terminal (−) of the comparator 322, whereas a detected voltage HVrf, which is part of the boosted voltage HV, is input into a positive input terminal (+) of the comparator 322.

The detected voltage HVrf is obtained by dividing the boosted voltage HV by a first voltage division circuit including a first resistor 324, a second resistor 326, and a first transistor 330 connected thereto in series or by a second voltage division circuit including the first resistor 324, a third resistor 328, and a second transistor 332 connected thereto in series.

An output terminal of an OR gate 334 is connected to a gate input terminal of the first transistor 330. The read signal RD representing the Read mode and the standby signal STB representing the Standby mode are input into an input terminal of the OR gate 334. The first transistor 330 functions as a switch that is turned ON when either one of the read signal RD and the standby signal STB is at the high level (in the active state). Similarly, an output terminal of an OR gate 336 is connected to a gate input terminal of the second transistor 332. The programming signal PGM representing the Program mode and the erasing signal ERS representing the Erase mode are input into an input terminal of the OR gate 336. The second transistor 332 functions as a switch that is turned ON when either one of the programming signal PGM and the erasing signal ERS is at the high level (in the active state).

When the read signal RD or the standby signal STB is at the high level (in the active state) to turn the first transistor 330 ON, the boosted voltage HV is divided by means of the first resistor 324 and the second resistor 326 and is input into the comparator 322 as the detected voltage HVrf. When the programming signal PGM or the erasing signal ERS is at the high level (in the active state) to turn the second transistor 332 ON, on the other hand, the boosted voltage HV is divided by means of the first resistor 324 and the third resistor 328 and is input into the comparator 322 as the detected voltage HVrf.

Equations (1) and (2) given below are held on the assumption that the ON resistances of the first and the second transistors 330 and 332 are negligible:

$$HV[\text{low}] = Vrf \cdot (1 + R1/Rr) \quad (1)$$

$$HV[\text{high}] = Vrf \cdot (1 + R1/Rp) \quad (2)$$

Here R1, Rr, and Rp respectively denote resistances of the first through the third resistors 324, 326, and 328.

As clearly understood from Equations (1) and (2) given above, the low boosted voltage HV[low] for turning the first transistor 330 ON and the high boosted voltage HV[high] for turning the second transistor 332 ON are independently set by regulating the resistances R1, Rr, and Rp of the first through the third resistors 324, 326, and 328. In this prior art structure, as mentioned previously, the low boosted voltage HV[low] to turn the first transistor 330 ON is set equal to 5.0 V in the Read mode and in the Standby mode. In the Program mode and in the Erase mode, the high boosted voltage HV[high] to turn the second transistor 332 ON is set equal to 8.0 V.

When the boosted voltage HV is higher than the low voltage of 5.0 V in the Read mode or in the Standby mode, the detected voltage HVrf input into the comparator 322 is higher than the reference voltage Vrf. The detection signal ACT output from the level sense circuit 320 is accordingly at the low level. The oscillation circuit 300 receives the detection signal ACT of the low level as the enable signal ENB and stops the oscillating operation.

When the boosted voltage HV is lower than the low voltage of 5.0 V in the Read mode or in the Standby mode, on the contrary, the detected voltage HVrf input into the comparator 322 is lower than the reference voltage Vrf. The detection signal ACT output from the level sense circuit 320 is accordingly at the high level. The oscillation circuit 300 receives the detection signal ACT of the high level as the enable signal ENB and starts the oscillating operation.

In a similar manner, in the Program mode or in the Erase mode, when the boosted voltage HV is higher than the high voltage of 8.0 V, the detected voltage HVrf is higher than the reference voltage Vrf. The detection signal ACT (the enable signal ENB) is accordingly at the low level to stop the oscillating operation in the oscillation circuit 300. When the boosted voltage HV is lower than the high voltage of 8.0 V, on the contrary, the detected voltage HVrf is lower than the reference voltage Vrf. The detection signal ACT (the enable signal ENB) is accordingly at the high level to start the oscillating operation in the oscillation circuit 300.

The feedback circuit including the oscillation circuit 300, the charge pump circuit 310, and the level sense circuit 320 functions to make the detected voltage HVrf equal to the reference voltage Vrf.

In the booster circuit 260, the oscillating operation of the oscillation circuit 300 and thereby the boosting operation of the charge pump circuit 310 are controlled according to the level of the boosted voltage HV detected by the level sense circuit 320. The charge pump circuit 310 is controlled to make the output voltage (boosted voltage) HV from the charge pump circuit 310 equal to the low boosted voltage HV[low] of 5.0 V in the Read mode or in the Standby mode and equal to the high boosted voltage HV[high] of 8.0 V in the Program mode or in the Erase mode.

The control voltage generation circuit included in the voltage generation circuit has a constant voltage circuit, which includes a regulator circuit and a transistor. The constant voltage circuit generates a desired constant voltage from the boosted voltage output from the booster circuit.

FIG. 9 is a circuit diagram showing the structure of a general constant voltage circuit 500 included in the control voltage generation circuit. As shown in FIG. 9, the constant voltage circuit 500 has a transistor Q and a regulator circuit 502 including an operational amplifier OP, a resistance R, and a variable resistance VR.

An input terminal 504 of the constant voltage circuit 500 receives the boosted voltage HV from the booster circuit 260. The reference voltage Vrf, which is input into the negative input terminal (−) of the comparator 322 in the level sense circuit 320 of the booster circuit 260, is also input into a positive input terminal (+) of the operational amplifier OP. An output terminal of the operational amplifier OP is connected to a gate of the p-type MOS transistor Q. The transistor Q has a source connecting with the input terminal 504 and a drain connecting with a negative input terminal (−) of the operational amplifier OP. The drain of the transistor Q is further coupled with a reference potential point via the resistance R and the variable resistance VR.

The transistor Q functions as a variable resistance element, whereas the operational amplifier OP varies the output to make the difference between two inputs equal to 0. The drain voltage of the transistor Q is thus coincident with the reference voltage Vrf. The voltage at an output terminal 508 of the constant voltage circuit 500 is obtained by dividing the reference voltage Vrf by means of the resistance R and the variable resistance VR. A desired constant voltage is generated from the output terminal 508 as the output of the constant voltage circuit 500 by adequately regulating the value of the variable resistance VR.

The prior art voltage generation circuit of the above construction has the problems discussed below at the power supply ON time or at the reset time of the non-volatile semiconductor memory device.

The non-volatile semiconductor memory device is generally in the Standby mode at the power supply ON time or at the reset time. The boosted voltage HV output from the booster circuit 260 is initially at the level of the power source voltage. It is thus required to raise the boosted voltage HV to the level of the standby voltage (5.0 V). In the constant voltage circuit 500 of the control voltage generation circuit that receives the input of the boosted voltage HV, there is a parasitic capacitance hung on the positive input terminal (+) in the operational amplifier OP in the regulator circuit 502, (that is, a parasitic capacitance between the HV input terminal 504 and a Vrf input terminal 506). At the power supply ON time or at the reset time of the non-volatile semiconductor memory device, with an abrupt increase in boosted voltage HV from the power source voltage to the standby voltage in the booster circuit 260, the reference voltage Vrf input into the positive input terminal (+) of the operational amplifier OP may be raised due to the parasitic capacitance.

The reference voltage Vrf is commonly input into the positive input terminal (+) of the operational amplifier OP and into the negative input terminal (−) of the comparator 322 in the level sense circuit 320 of the booster circuit 260, as mentioned previously. Even when the boosted voltage HV reaches the standby voltage (5.0 V), the detected voltage HVrf input into the comparator 322 is still lower than the reference voltage Vrf, which has increased with a rise in boosted voltage HV. The detection signal ACT output from the level sense circuit 320 is then kept at the high level and is input as the enable signal ENB into the oscillation circuit 300. The oscillation circuit 300 accordingly does not stop the oscillating operation but continues oscillation. The boosted voltage HV thus exceeds the standby voltage and continues rising. In the Standby mode at the power supply ON time or at the reset time, it is accordingly difficult to set the boosted voltage HV equal to the standby voltage.

SUMMARY OF THE INVENTION

The advantage of the present invention is thus to solve the problems of the prior art technique discussed above and to provide a booster circuit for a non-volatile semiconductor memory device, which desirably eliminates the effects of a parasitic capacitance and effectively interferes with an increase in reference voltage accompanied by an increase in boosted voltage.

In order to attain at least part of the above and the other related objects, the present invention is directed to a booster circuit applied for a non-volatile semiconductor memory device, which includes a memory cell array of multiple non-volatile memory elements and has an operation mode including at least a standby mode to stand ready for an access to one of the multiple non-volatile memory elements. The booster circuit boosts a power source voltage and outputs a boosted voltage according to the operation mode. The booster circuit includes: a rising time period detection circuit that detects a rising time period between a power supply ON time or a reset time of the non-volatile semiconductor memory device and a time when the boosted voltage reaches a desired voltage corresponding to the standby mode; an oscillation circuit that carries out an oscillating operation to generate and output a clock signal, the oscillation circuit generating a signal of a preset frequency, which is lower than a frequency in an ordinary state, as the clock signal during at least the rising time period, based on a result of the detection by the rising time period detection circuit; a charge pump circuit that boosts the power source voltage and outputs the boosted voltage, in response to the clock signal output from the oscillation circuit; and a level sense circuit that controls the oscillating operation carried out by the oscillation circuit, so as to make the boosted voltage output from the charge pump circuit equal to a predetermined setting voltage according to the operation mode, based on a reference voltage.

The booster circuit of the present invention keeps the frequency of the clock signal output from the oscillation circuit to the charge pump circuit lower than the frequency in the ordinary state, during the rising time period between the power supply ON time or the reset time and the time when the boosted voltage reaches the desired voltage corresponding to the standby mode. The booster voltage output from the charge pump circuit thus gently rises from the level of the power supply voltage during this rising time period. Even in the presence of a parasitic capacitance in the operational amplifier of the regulator circuit in the constant voltage circuit of the constant voltage generation circuit located after the booster circuit, a small time variation in level of the boosted voltage supplied to the constant voltage circuit desirably eliminates the effects of the parasitic capacitance. The reference voltage commonly used for the operational amplifier and the comparator is thus not increased due to the parasitic capacitance with an increase in boosted voltage but is kept at a substantially constant level.

In the booster circuit of the present invention, the frequency of the clock signal may be a fixed value or may vary with time during at least the rising time period. The only requirement is that the clock signal has the frequency lower than the frequency in the ordinary state.

In the booster circuit of the present invention, each of the non-volatile memory elements in the non-volatile semiconductor memory device, for which the booster circuit is applied, may be a twin memory cell controlled by one word gate and two control gates.

This arrangement allows operations in multiple operation modes, for example, a data reading mode, a data programming mode, and a data erasing mode, with regard to the memory cell array of multiple twin memory cells.

In the booster circuit of the present invention, each of the non-volatile memory elements in the non-volatile semiconductor memory device, for which the booster circuit is applied, may have an ONO membrane that includes an oxide film (O), a nitride film (N), and an oxide film (O) and functions as a trap site of electric charges.

This arrangement enables the booster circuit to boost the power source voltage in a device using MONOS non-volatile memory elements.

The present invention is not restricted to the applications of the booster circuit discussed above, but is actualized by a diversity of other applications, for example, a voltage generation circuit including the booster circuit and a non-volatile semiconductor memory device including the booster circuit.

The above and other objects, features, aspects, and advantages of the present invention will become more apparent from the following detailed description of the preferred embodiment with the accompanying drawings.

DESCRIPTION OF THE PREFERRED EMBODIMENT

Figure 1:
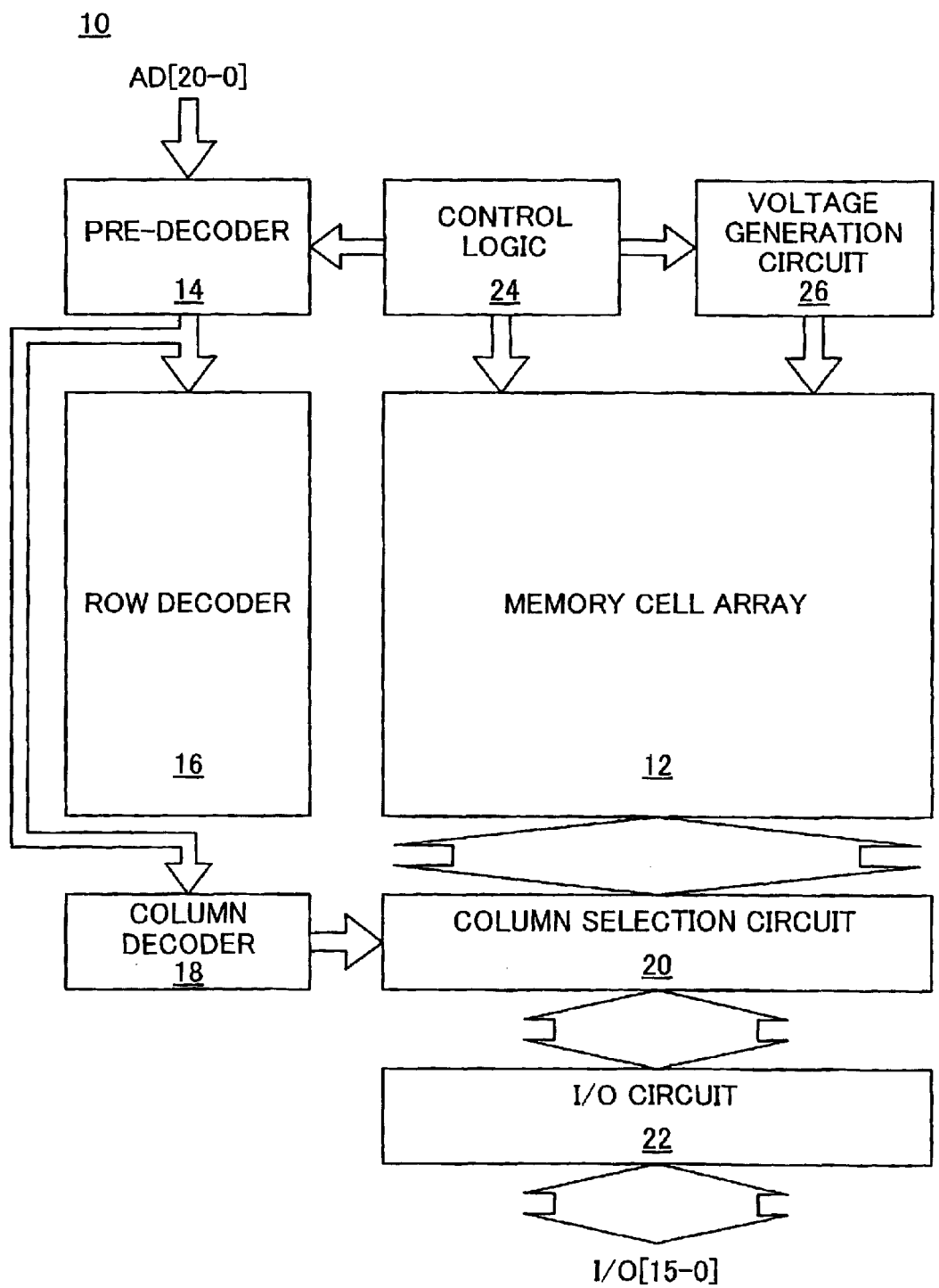
FIG. 1 is a block diagram schematically illustrating the general construction of a typical non-volatile semiconductor memory device.

One mode of carrying out the present invention is discussed below as a preferred embodiment in the following sequence:

A. Construction and Operations of Non-volatile Semiconductor Memory Device
B. Structure and Operations of Memory Cells
C. Structure and Operations of Voltage Generation Circuit
D. Structure and Operations of Booster Circuit
   D-1. Operations at Power Supply ON time or at Reset Time
   D-2. Operations in Ordinary State
   D-3. Effects of Embodiment
E. Modifications A. Construction and Operations of Non-volatile Semiconductor Memory Device FIG. 1 is a block diagram schematically illustrating the general construction of a typical non-volatile semiconductor memory device 10. The non-volatile semiconductor memory device 10 mainly includes a memory cell array 12, a pre-decoder 14, a row decoder 16, a column decoder 18, a column selection circuit 20, an I/O circuit 22, a control logic 24, and a voltage generation circuit 26. The non-volatile semiconductor memory device 10 also has a diversity of other circuits (not shown) including an address buffer, an input-output buffer, a control buffer, and a sense amplifier. For simplicity of explanation, these circuit elements are omitted from the illustration of FIG. 1.

The pre-decoder 14, the row decoder 16, and the column decoder 18 function to decode an address signal, which specifies a selected non-volatile memory element (selected cell) included in the memory cell array 12. In the example of FIG. 1, a 21-bit address signal AD[20-0] is input into the pre-decoder 14.

The column selection circuit 20 selects a bit line corresponding to a selected cell specified by the column decoder 18 and connects the selected bit line to a circuit, such as a sense amplifier, included in the I/O circuit 22. The I/O circuit 22 implements output of reading data or input of writing data.

The control logic 24 generates and output control signals in response to diverse control inputs (not shown), for example, a control signal to the voltage generation circuit 26.

The voltage generation circuit 26 is controlled by the control logic 24 and generates multiple control voltages applied to the memory cell array 12.

B. Structure and Operations of Memory Cells

Figure 2:
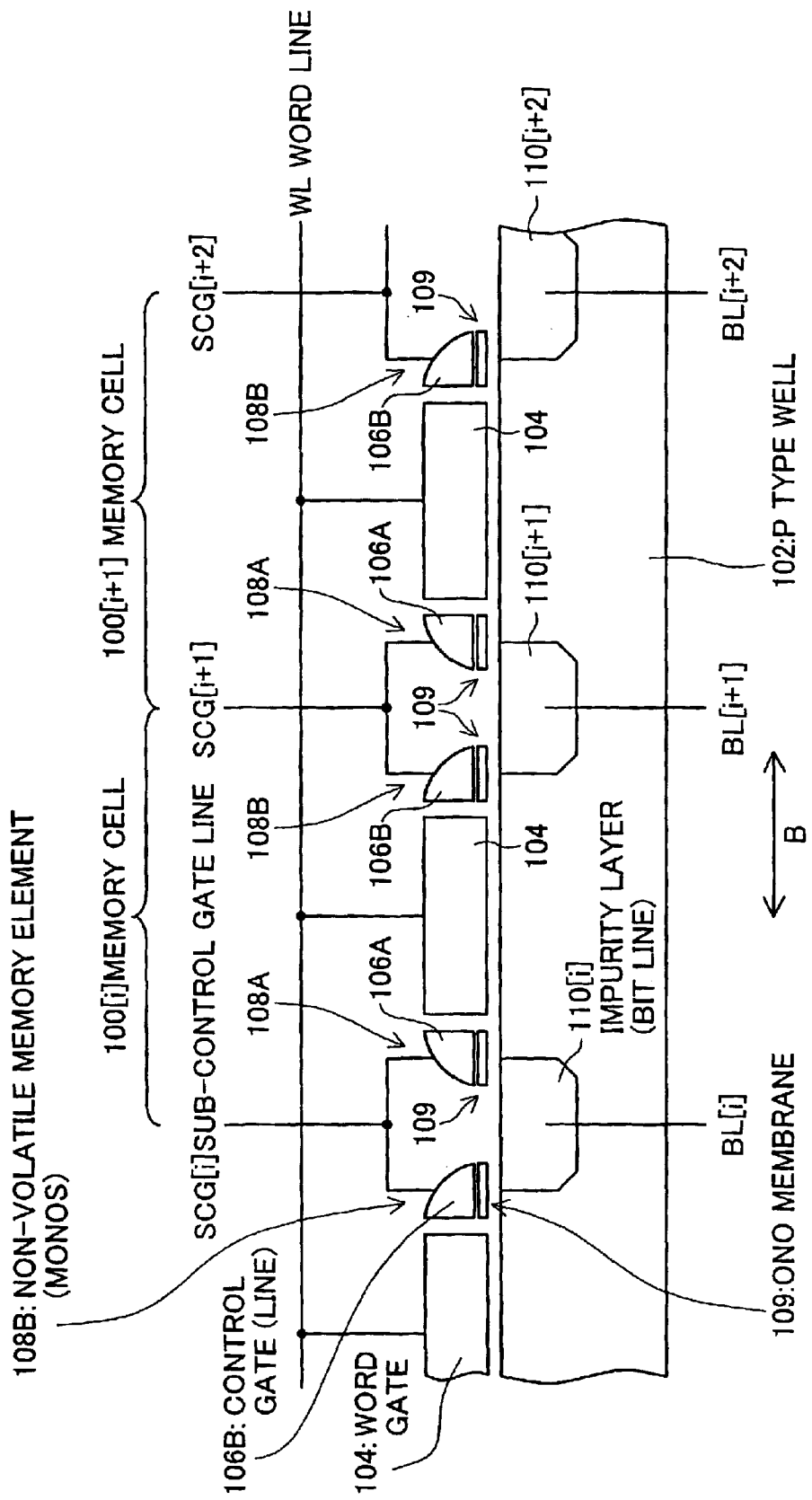
FIG. 2 is a sectional view schematically illustrating the structure of twin memory cells.

The following describes the structure and the operations of twin memory cells 100 used as the memory elements constituting the memory cell array 12. FIG. 2 is a sectional view schematically illustrating the structure of the twin memory cells 100.

Referring to FIG. 2, multiple twin memory cells 100 ( . . . , 100[i], 100[i+1], . . . : i is an integer of not less than 1) are arrayed in a direction B (hereafter referred to as a row direction or a word line direction) on a P type well 102. The twin memory cells 100 are also arrayed in multiple columns in a column direction (that is, a direction perpendicular to the sheet surface of FIG. 2: hereafter may also be referred to as a bit line direction). Namely the memory cell array 12 has the twin memory cells 100 arranged in a matrix.

Each twin memory cell 100 has a word gate 104 formed on the P type well 102 via a gate insulating film, a first memory element (MONOS memory element) 108A with a first control gate 106A, and a second memory element (MONOS memory element) 108B with a second control gate 106B.

Each of the first and the second memory elements 108A and 108B has an ONO membrane 109, which is a laminate of an oxide membrane (O), a nitride membrane (N), and an oxide membrane (O), on the P type well 102. The ONO membrane 109 traps electric charges. The first control gate 106A and the second control gate 106B are respectively formed on the ONO membranes 109 of the first and the second memory elements 108A and 108B. The working conditions of the first and the second MONOS memory elements 108A and 108B are controlled by the first and the second control gates 106A and 106B, which are composed of polysilicon corresponding to M (metal) of the MONOS. The first and the second control gates 106A and 106B may be composed of a conductive material, such as a suicide.

The word gate 104, which is composed of a material, for example, a polysilicon-containing material, is formed between the first and the second memory elements 108A and 108B to be electrically insulated from the first and the second memory elements 108A and 108B. Selection of the first and the second memory elements 108A and 108B of each twin memory cell 100 is determined in response to a voltage applied to the word gate 104.

As discussed above, each twin memory cell 100 has the first and the second MONOS memory elements 108A and 108B with split gates (that is, the first and the second control gates 106A and 106B). One word gate 104 is shared by the first and the second MONOS memory elements 108A and 108B.

The first and the second MONOS memory elements 108A and 108B independently function as trap sites of electric charges. Multiple word gates 104, which respectively control the trap of electric charges, are arrayed in the direction B (the row direction) at preset intervals as shown in FIG. 2, and are connected in common to one word line WL composed of, for example, polycide. Application of a preset control voltage to the word line WL enables selection of at least one of the first and the second memory elements 108A and 108B in each of the twin memory cells 100 on an identical row.

Each of the control gates 106A and 106B is extended in the column direction and is shared by multiple twin memory cells 100 arranged on an identical column, so as to function as a control gate line. The control gates 106A and 106B, which are included in two different but adjacent twin memory cells 100 in the row direction and adjoin to each other, are connected in common to a sub-control gate line SCG ( . . . SCG[i], SCG[i+1], . . . ). The sub-control gate lines SCG are composed of a metal layer, which is an upper layer than the word gates 104, the control gates 106A and 106B, and the word lines WL. The two memory elements 108A and 108B in each twin memory cell 100 are controlled independently by independent application of control voltages to the respective sub-control gate lines SCG, as discussed later.

An impurity layer 110 ( . . . , 110[i], 110[i+1], . . . ) is formed in the P type well 102 between each pair of adjoining memory elements 108A and 108B, which are included in two different but adjacent twin memory cells 100 in the row direction. Each of the impurity layers 110, for example, an n type impurity layer formed in the P type well 102, is extended in the column direction and is shared by multiple twin memory cells 100 arranged on an identical column, so as to function as a bit line BL ( . . . BL[i], BL[i+1]. . . ).

Application of a voltage to the bit line BL and detection of a current enable electric charges (information) to be read and written (programmed) from and into one of the memory elements 108A and 108B in each twin memory cell 100 specified by the word line WL and the sub-control gate line SCG.

C. Structure and Operations of Voltage Generation Circuit

A plurality of different control voltages to be applied to the memory cell array 12 are required in respective operation modes, a Read mode, a Program mode, an Erase mode, and a Standby mode. The voltage generation circuit 26 thus generates diverse control voltages required for the respective operation modes.

Figure 3:
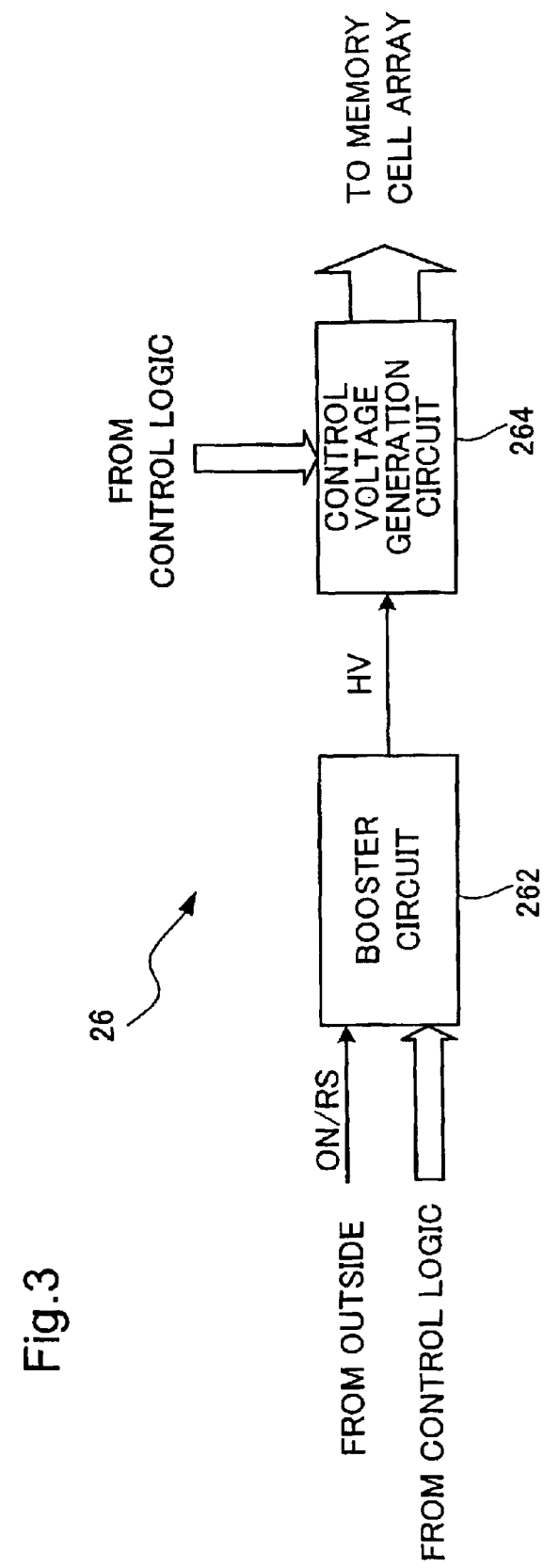
FIG. 3 is a block diagram showing the construction of a voltage generation circuit including a booster circuit in one embodiment of the present invention.

FIG. 3 is a block diagram showing the structure of the voltage generation circuit 26 including a booster circuit 262 in one embodiment of the present invention. As shown in FIG. 3, the voltage generation circuit 26 has a control voltage generation circuit 264, in addition to the booster circuit 262 of this embodiment.

Figure 9:
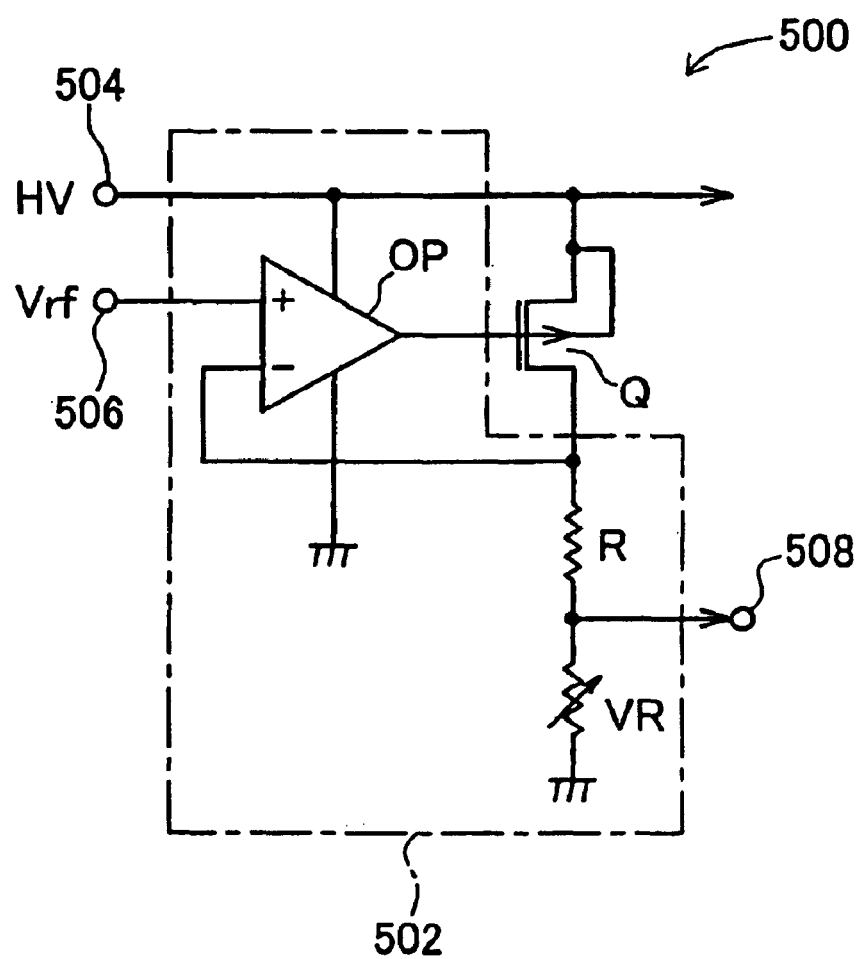
FIG. 9 is a circuit diagram showing a constant voltage circuit used for a general control voltage generation circuit.

The control voltage generation circuit 264 utilizes a boosted voltage HV output from the booster circuit 262 and generates a plurality of different voltages required for the respective operation modes, in response to control signals from the control logic 24. The control voltage generation circuit 264 has a constant voltage circuit 500 as shown in FIG. 9.

The booster circuit 262 boosts a power source voltage Vdd according to each operation mode in response to a control signal from the control logic 24, and outputs a desired boosted voltage HV. More specifically, the booster circuit 262 boosts the power source voltage Vdd of, for example, 1.8 V to a high voltage of 8.0 V and outputs the high voltage of 8.0 V in a Program (data writing) mode and in an Erase (data erasing) mode. The booster circuit 262 boosts the power source voltage Vdd of 1.8 V to a low voltage of 5.0 V and outputs the low voltage of 5.0 V in a Read (data reading) mode and in a Standby mode.

D. Structure and Operations of Booster Circuit

Figure 4:
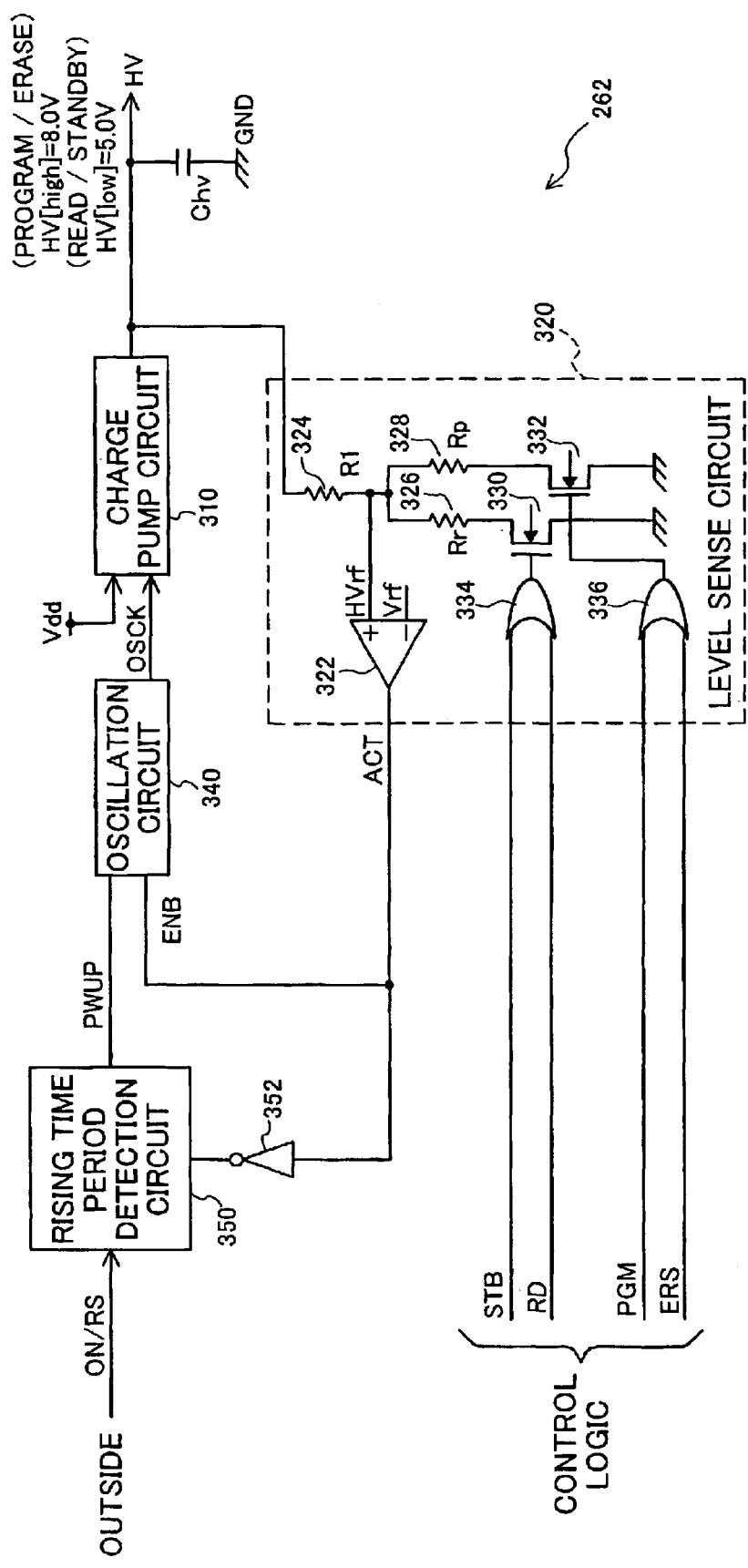
FIG. 4 is a circuit diagram showing the structure of the booster circuit of FIG. 3.

FIG. 4 is a circuit diagram showing the structure of the booster circuit 262 of FIG. 3. The booster circuit 262 of this embodiment has a rising time period detection circuit 350, in addition to an oscillation circuit 340, a charge pump circuit 310, and a level sense circuit 320 as shown in FIG. 4.

Figure 8:
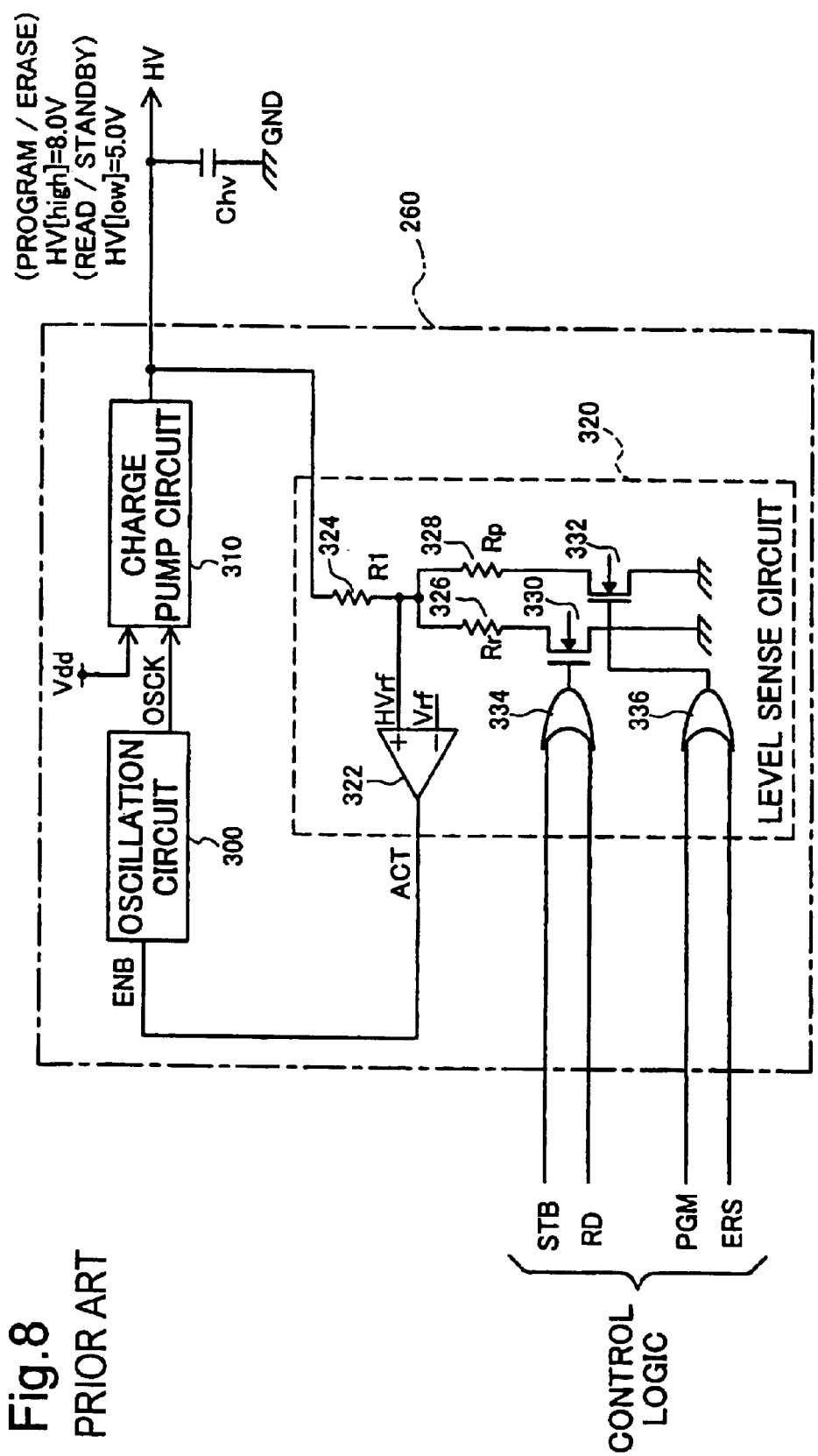
FIG. 8 is a circuit diagram showing the structure of a prior art booster circuit.

The charge pump circuit 310 and the level sense circuit 320 shown in FIG. 4 have identical structures to those of the charge pump circuit 310 and the level sense circuit 320 shown in FIG. 8. Here the level sense circuit 320 is not described specifically.

The charge pump circuit 310 boosts the power source voltage Vdd in response to a supplied clock signal OSCK and outputs the boosted voltage HV, as described previously. The concrete boosting procedure carried out by the charge pump circuit 310 successively accumulates a preset voltage synchronously with the supplied clock signal OSCK, so as to boost the power source voltage Vdd. The higher frequency of the supplied clock signal OSCK leads to the quicker boosting and causes the boosted voltage HV to abruptly increase. The lower frequency of the clock signal OSCK, on the other hand, leads to the slower boosting and causes the boosted voltage HV to gently increase.

Figure 5A:
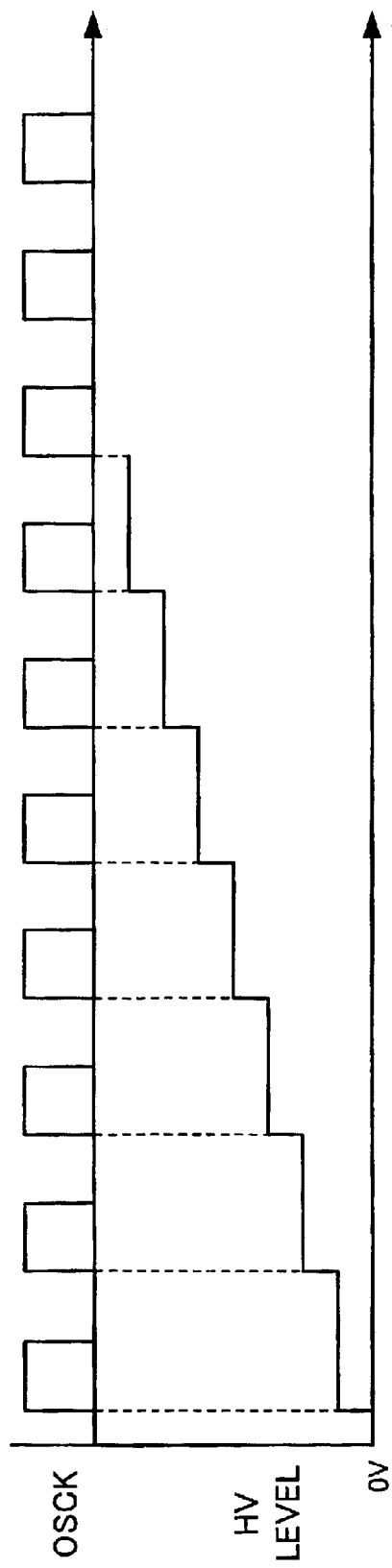
FIGS. 5(a) and 5(b) are timing charts showing variations in boosted voltage HV output from a charge pump circuit in response to a clock signal OSCK.
Figure 5B:
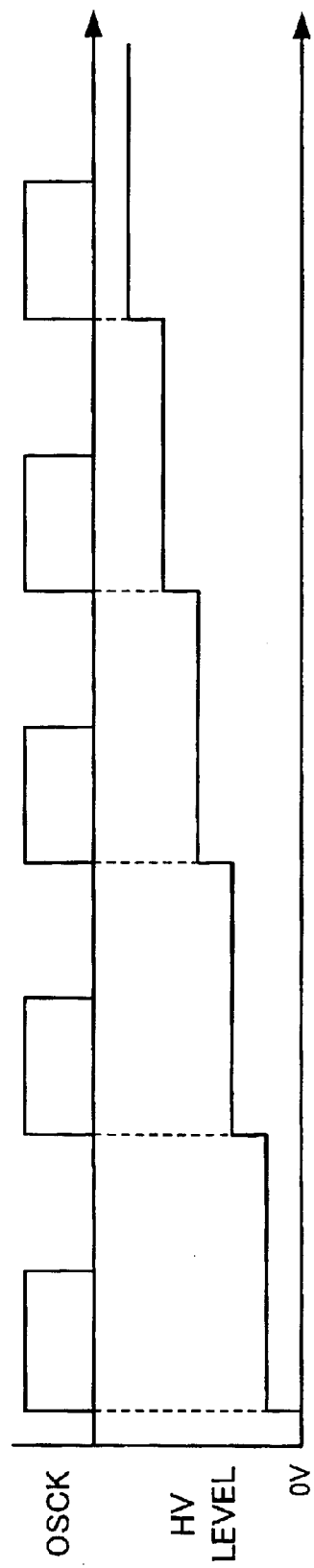

The relationship between the clock signal OSCK and the boosted voltage HV in the charge pump circuit 310 is schematically shown in the graphs of FIG. 5.

The graph of FIG. 5(*a*) shows a variation in level of the boosted voltage HV in the case of a relatively high frequency of the clock signal OSCK. The graph of FIG. 5(*b*) shows a variation in level of the boosted voltage HV in the case of a relatively low frequency of the clock signal OSCK.

As clearly shown in the graphs of FIG. 5, the boosted voltage HV output from the charge pump circuit 310 abruptly rises in the case of a relatively high frequency of the supplied clock signal OSCK, while gently rising in the case of a relatively low frequency of the clock signal OSCK.

Referring back to FIG. 4, the rising time period detection circuit 350 receives an externally supplied power supply ON/reset signal ON/RS and a detection signal ACT output from the level sense circuit 320 via an inverter 352, detects a time period between a power supply ON time or a reset time and a time when the boosted voltage HV reaches a standby voltage (5.0 V) (rising time period) in response to the input signals ON/RS and ACT, and outputs a detection signal PWUP representing a result of the detection. The detection signal PWUP is at the high level (in the active state) during the rising time period and is otherwise at the low level (in the inactive state).

The oscillation circuit 340 has a different fundamental structure from that of the oscillation circuit 300 shown in FIG. 8. The oscillation circuit 300 included in the prior art structure shown in FIG. 8 outputs the clock signal OSCK of a fixed frequency. The oscillation circuit 340 of this embodiment, on the other hand, outputs the clock signal OSCK of a variable frequency. The frequency of the clock signal OSCK output from the oscillation circuit 340 is varied in response to the detection signal PWUP from the rising time period detection circuit 350.

When the detection signal PWUP is at the low level (that is, in the inactive state), the oscillation circuit 340 generates and outputs the clock signal OSCK of a preset frequency Hr in the ordinary state. When the detection signal PWUP is at the high level (that is, in the active state), on the other hand, the oscillation circuit 340 generates and outputs the clock signal OSCK of a constant frequency Ha, which is lower than the frequency Hr in the ordinary state.

The oscillation circuit 340 that is capable of changing over the frequency of the output clock signal OSCK may be actualized, for example, by either of the constructions discussed below.

One available structure uses a ring oscillator. While an oscillating signal generated by the ring oscillator is output as the clock signal OSCK, the electric current from a current source in the ring oscillator is varied to change the oscillation frequency of the ring oscillator. This varies the frequency of the oscillating signal or the clock signal OSCK output from the ring oscillator.

Another available structure uses a ring oscillator and a variable frequency divider. The ring oscillator is oscillated at a fixed frequency to output an oscillating signal. The variable frequency divider divides the frequency of the oscillating signal output from the ring oscillator and outputs the frequency-divided signal as the clock signal OSCK. The frequency of the clock signal OSCK may be varied by regulating the ratio of frequency division in the variable frequency divider.

The oscillation circuit 340 outputs the clock signal OSCK to the charge pump circuit 310 in response to an enable signal ENB from the level sense circuit 320, like the oscillation circuit 300 of the prior art shown in FIG. 8. The oscillating operation of the oscillation circuit 340 stops when the enable signal ENB is at the low level (in the inactive state). The oscillating operation of the oscillation circuit 340 starts, on the other hand, when the enable signal ENB is at the high level (in the active state).

In the structure of this embodiment, the frequency of the clock signal OSCK output from the oscillation circuit 340 is set equal to the constant value Ha, which is lower than the frequency Hr in the ordinary state, during the rising time period at the power supply ON time or at the reset time. The charge pump circuit 310 receives the clock signal OSCK of the lower constant frequency Ha and carries out the boosting operation in response to this clock signal OSCK. The boosted voltage HV output from the charge pump circuit 310 thus gently rises from the power source voltage to the standby voltage. This desirably eliminates the effects of the parasitic capacitance in the constant voltage circuit 500 of the subsequent control voltage generation circuit 264.

D-1. Operations at Power Supply ON Time or at Reset Time

Figure 6:
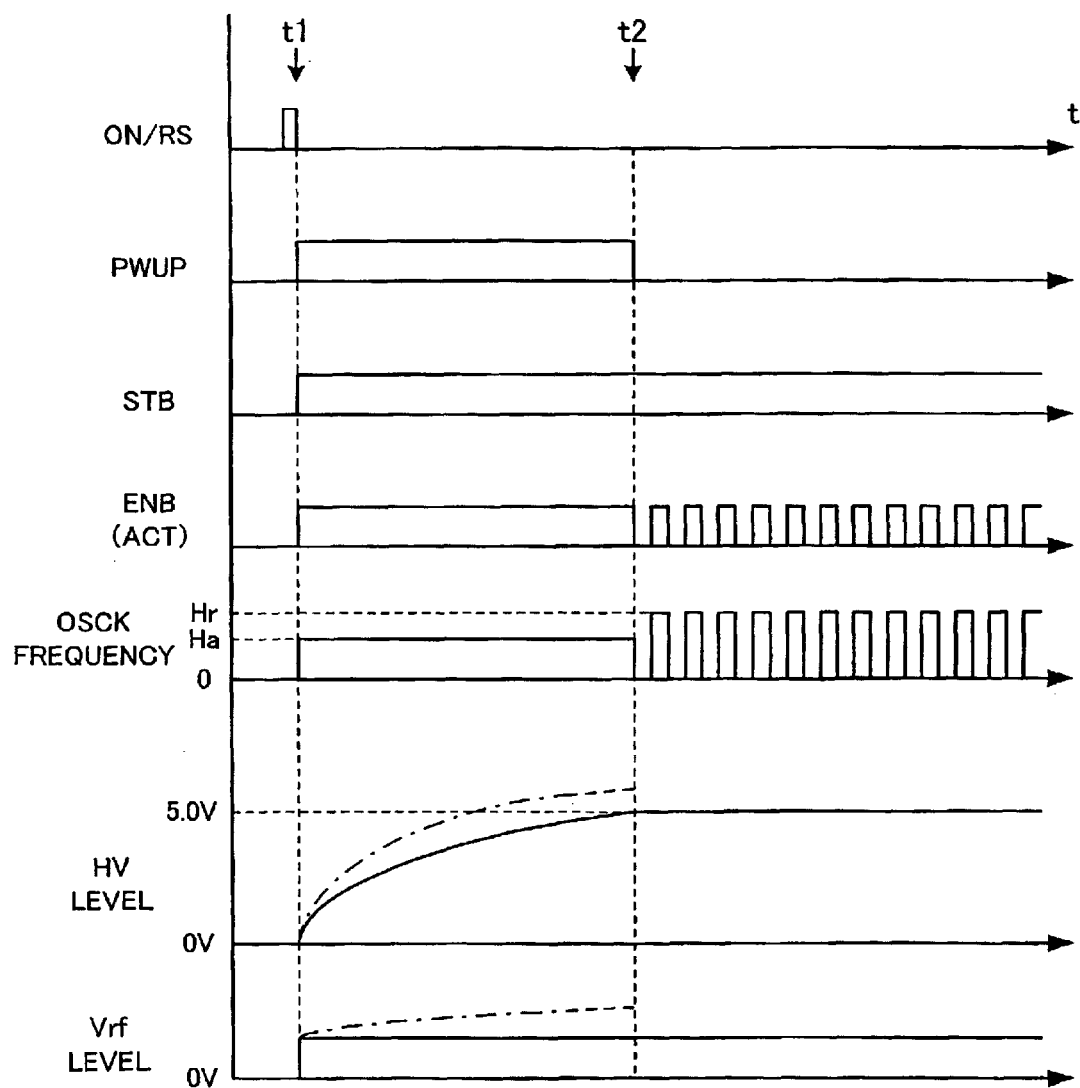
FIG. 6 is a timing chart showing timings of primary signals after a power supply ON time or a reset time.

FIG. 6 is a timing chart showing the timings of primary signals after the power supply ON time or at the reset time. In the timing chart of FIG. 6, the power supply ON/reset signal ON/RS, the detection signal PWUP, a standby signal STB, and the enable signal ENB (ACT) show the changeover timings to the high level or to the low level. The clock signal OSCK shows the timings of frequency variation. The boosted voltage HV and a reference voltage Vrf show the timings of voltage level variation.

Referring to FIG. 6, at a fall timing (at a time point t1) of the externally input power supply ON/reset signal ON/RS, which represents the power ON or reset of the semiconductor memory device, the rising time period detection circuit 350 rises the detection signal PWUP representing the rising time period to the high level (active state). In the case of the power ON or reset of the semiconductor memory device, the operation mode starts from the standby mode. The standby signal STB representing the standby mode accordingly rises to the high level (active state) and is output from the control logic 24 to the level sense circuit 320.

The power ON operation or the reset operation causes the reference voltage Vrf to be given to a negative input terminal (−) of a comparator 322 in the level sense circuit 320. In response to the rise of the standby signal STB input from the control logic 24 to the high level, a first transistor 330 in the level sense circuit 320 is turned ON, and the boosted voltage HV is divided by a first resistance 324 and a second resistance 326 and is input as a detected voltage HVrf into a positive input terminal (+) of the comparator 322. At the power supply ON time or at the reset time, the boosted voltage HV is initially equal to the power source voltage. The detected voltage HVrf is accordingly less than the reference voltage Vrf, so that the detection signal ACT output from the comparator 322 is set at the high level. Input of the enable signal ENB at the high level (in the active state) causes the oscillation circuit 340 to start the oscillating operation.

The oscillation circuit 340 receives the detection signal PWUP, which is output from the rising time period detection circuit 350 and has risen to the high level (active state). The oscillation circuit 340 accordingly generates the clock signal OSCK of the constant frequency Ha, which is lower than the frequency Hr in the ordinary state, and outputs the clock signal OSCK of the lower constant frequency Ha to the charge pump circuit 310.

The charge pump circuit 310 receives the clock signal OSCK supplied from the oscillation circuit 340 and boosts the power source voltage Vdd in response to the input clock signal OSCK. The clock signal OSCK supplied at this moment has the constant frequency Ha lower than the frequency Hr in the ordinary state, so that the charge pump circuit 310 gradually boosts the power source voltage Vdd. The boosted voltage HV output from the charge pump circuit 310 thus gently rises from 0 V to the standby voltage of 5.0 V.

At a timing when the gradually rising boosted voltage HV reaches the standby voltage (5.0 V) (at a time point t2), the detected voltage HVrf exceeds the reference voltage Vrf in the comparator 322. The detection signal ACT output from the comparator 322 thus falls to the low level. The oscillation circuit 340 then receives the enable signal ENB falling to the low level (the inactive state) and stops the oscillating operation.

When the oscillation circuit 340 stops the oscillating operation, no clock signal OSCK is supplied from the oscillating circuit 340 to the charge pump circuit 310. The charge pump circuit 310 accordingly stops the boosting operation.

As described above, during the rising time period at the power supply ON time or at the reset time, the oscillation circuit 340 outputs the clock signal OSCK having the lower frequency Ha than the frequency Hr in the ordinary state to the charge pump circuit 310. The boosted voltage HV thus gently rises from 0 V to the standby voltage (5.0 V). This arrangement desirably eliminates the effects of the parasitic capacitance in the constant voltage circuit 500 of the subsequent control voltage generation circuit 264.

In the timing chart of FIG. 6, for the comparison between this embodiment and the prior art structure, the variation in level of the boosted voltage HV and the variation in level of the reference voltage Vrf with regard to this embodiment are shown by the solid line curve, whereas those with regard to the prior art structure are shown by the one-dot chain line curves.

In the prior art structure, the oscillation circuit 300 generates and outputs the clock signal having the frequency Hr in the ordinary state. Due to the high frequency of the clock signal OSCK, the boosted voltage HV output from the charge pump circuit 310 thus abruptly rises from the power source voltage to the standby voltage (5.0 V). In the constant voltage circuit 500 of the control voltage generation circuit 264 receiving the boosted voltage HV, the parasitic capacitance present in the operational amplifier OP of the regulator circuit 502 raises the reference voltage Vrf used in the operational amplifier OP. The reference voltage Vrf is also used in the comparator 322 of the level sense circuit 320. As shown by the one-dot chain line curve in the timing chart of FIG. 6, even when the boosted voltage HV reaches the standby voltage (5.0 V), the detected voltage HVrf input into the comparator 322 is still lower than the raised reference voltage Vrf. The oscillation circuit 300 thus does not stop the oscillating operation but continues oscillation. The boosted voltage HV accordingly exceeds the standby voltage (5.0 V) and continues rising as shown by the one-dot chain line curve in FIG. 6.

In the structure of this embodiment, on the other hand, the oscillation circuit 340 generates the clock signal OSCK having the constant frequency Ha lower than the frequency Hr in the ordinary state and outputs the clock signal OSCK of the lower constant frequency Ha to the charge pump circuit 310. The boosted voltage HV output from the charge pump circuit 310 thus gently rises as shown by the solid line curve in the timing chart of FIG. 6. Even in the presence of parasitic capacitance in the operational amplifier OP of the regulator circuit 502 included in the constant voltage circuit 500 of the control voltage generation circuit 264, a small time variation in level of the boosted voltage HV supplied to the constant voltage circuit 500 desirably eliminates the effects of the parasitic capacitance. This arrangement preferably prevents the reference voltage Vrf commonly used in the operational amplifier OP and the comparator 322 from being raised due to the parasitic capacitance. The reference voltage Vrf is thus kept at a substantially constant level as shown by the solid line curve in FIG. 6. When the boosted voltage HV reaches the standby voltage (5.0 V), the detected voltage HVrf input into the comparator 322 exceeds the reference voltage Vrf. The oscillation circuit 340 then stops the oscillating operation. The boosted voltage HV thus does not become significantly greater than the standby voltage (5.0 V) but is converged to the standby voltage.

The arrangement of this embodiment thus eliminates the effects of the parasitic capacitance at the power supply ON time or at the reset time and effectively interferes with an increase in reference voltage accompanied by the increase in boosted voltage.

D-2. Operations in Ordinary State

When the boosted voltage HV reaches the standby voltage (5.0 V) and the detection signal ACT output from the comparator 322 is set at the low level, the detection signal ACT is inverted to the high level by an inverter 352 and is input into the rising time period detection circuit 350. The rising time period detection circuit 350 makes the detection signal PWUP fall to the low level (the inactive state) at the timing of the fall of the inverted signal (at the time point t2). Once making the detection signal PWUP fall to the low level (the inactive state), the rising time period detection circuit 350 does not make the detection signal PWUP rise to the high level (the active state) until an external input of the power supply ON/reset signal ON/RS.

When the charge pump circuit 310 stops the boosting operation as discussed above, the boosted voltage HV gradually decreases to be lower than the standby voltage (5.0 V). In the comparator 322, the detected voltage HVrf then becomes lower than the reference voltage Vrf. The detection signal ACT output from the comparator 322 thus rises to the high level. The oscillation circuit 340 receives the enable signal ENB risen to the high level (the active state) and thereby resumes the oscillating operation.

On start of the oscillating operation in the oscillation circuit 340, supply of the clock signal OSCK is resumed from the oscillation circuit 340 to the charge pump circuit 310. The charge pump circuit 310 thus resumes the boosting operation.

The oscillation circuit 340 receives the detection signal PWUP, which is output from the rising time period detection circuit 350 and has fallen to the low level (the inactive state), and generates and outputs the clock signal OSCK having the frequency Hr in the ordinary state, which is higher than the frequency Ha, to the charge pump circuit 310.

On re-start of the boosting operation in the charge pump circuit 310, the boosted voltage HV output from the booster circuit 262 again starts rising to reach the standby voltage (5.0 V). At this moment, the detected voltage HVrf exceeds the reference voltage Vrf in the comparator 322. The detection signal ACT output from the comparator 322 is thus set at the low level. The oscillation circuit 340 then receives the enable signal ENB fallen to the low level (the inactive state) and again stops the oscillating operation.

The repeated stop and re-start of the oscillating operation in the oscillation circuit 340 and the boosting operation in the charge pump circuit 310 keeps the boosted voltage HV output from the charge pump circuit 310 at the level of the standby voltage (5.0 V).

As described above, once making the detection signal PWUP fall to the low level (the inactive state), the rising time period detection circuit 350 keeps the detection signal PWUP at the low level until an external input of the power supply ON/reset signal ON/RS. After the boosted voltage HV has risen from the power source voltage and reached the standby voltage (5.0 V), the frequency of the clock signal OSCK output from the oscillation circuit 340 is kept equal to the frequency Hr in the ordinary state, which is higher than the frequency Ha. In the ordinary state after the power supply ON time or the reset time, the charge pump circuit 310 is accordingly driven in response to the clock signal OSCK of the relatively high frequency Hr. The charge pump circuit 310 thus ensures the sufficient current capacity while supplying the generated voltage to the subsequent loading (for example, the memory cell array 12).

D-3. Effects of Embodiment

As described above, the structure of the embodiment sets the frequency of the clock signal OSCK, which is supplied from the oscillation circuit 340 to the charge pump circuit 310 during the rising time period at the power supply ON time or at the reset time, equal to the constant value Ha, which is lower than the frequency Hr in the ordinary state. Such setting causes the boosted voltage HV output from the charge pump circuit 310 to gradually rise from 0 V. This arrangement desirably eliminates the effects of the parasitic capacitance and effectively prevents a rise in reference voltage accompanied with the rise in boosted voltage.

E. Modifications

The above embodiment and its applications are to be considered in all aspects as illustrative and not restrictive. There may be many modifications, changes, and alterations without departing from the scope or spirit of the main characteristics of the present invention.

Figure 7:
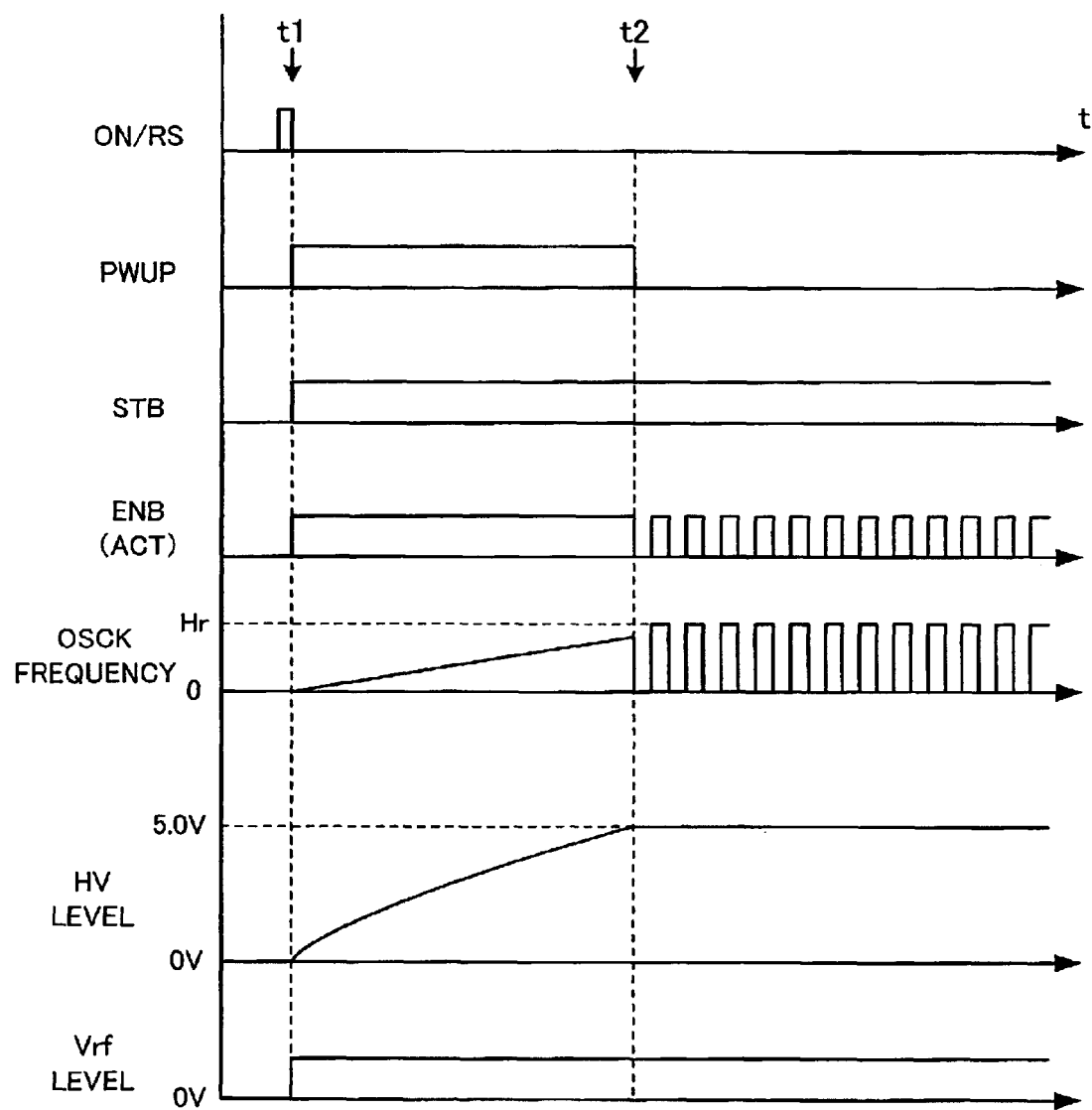
FIG. 7 is a timing chart showing timings of the primary signals when the clock signal OSCK supplied from an oscillation circuit to the charge pump circuit at the power supply ON time or at the reset time has another variation in frequency.

In the embodiment discussed above, the frequency of the clock signal OSCK, which is supplied from the oscillation circuit 340 to the charge pump circuit 310 at the power supply ON time or at the reset time, is set equal to the constant value Ha, which is lower than the frequency Hr in the ordinary state. The available setting is, however, not restricted to such a constant frequency, but may be a varying frequency with time. For example, as shown in FIG. 7, the frequency of the clock signal OSCK may be set equal to 0 Hz at the power supply ON time or at the reset time (time point t1) and rise proportionally to the elapse of time. The frequency of the clock signal OSCK may alternatively be varied with time in a stepwise manner. The only requirement is that the frequency of the clock signal OSCK is lower than the frequency Hr in the ordinary state.

The non-volatile memory elements 108A and 108B are not restricted to the MONOS structure. The technique of the present invention is applicable to non-volatile semiconductor memory devices using a diversity of other twin memory cells that include one word gate and first and second control gates to trap electric charges independently at two different positions.

In the above embodiment, the boosted voltage HV is equal to 5.0 V in the Standby mode and in the Read mode (that is, the standby voltage of 5.0 V), and is equal to 8.0 V in the Program mode and in the Erase mode. These values are, however, not restrictive, but a variety of other values may be applied for the boosted voltage HV.

The scope and spirit of the present invention are indicated by the appended claims, rather than by the foregoing description.

What is claimed is:

1. A booster circuit applied for a non-volatile semiconductor memory device, which comprises a memory cell array of multiple non-volatile memory elements and has an operation mode including at least a standby mode to stand ready for an access to one of the multiple non-volatile memory elements, the booster circuit boosting a power source voltage and outputting a boosted voltage according to the operation mode, the booster circuit comprising:

a rising time period detection circuit that detects a rising time period between a power supply ON time or a reset time of the non-volatile semiconductor memory device and a time when the boosted voltage reaches a desired voltage corresponding to the standby mode;

an oscillation circuit that carries out an oscillating operation to generate and output a clock signal, the oscillation circuit generating a signal of a frequency, which is lower than a preset frequency in an ordinary state, as the clock signal during at least the rising time period, based on a result of the detection by the rising time period detection circuit;

a charge pump circuit that boosts the power source voltage and outputs the boosted voltage, in response to the clock signal output from the oscillation circuit; and a level sense circuit that controls the oscillating operation carried out by the oscillation circuit, so as to make the boosted voltage output from the charge pump circuit equal to a predetermined setting voltage according to the operation mode, based on a reference voltage.

2. A booster circuit in accordance with claim 1, wherein the oscillation circuit generates a signal of a fixed frequency as the clock signal during at least the rising time period.

3. A booster circuit in accordance with claim 2, wherein each of the non-volatile memory elements in the non-volatile semiconductor memory device, for which the booster circuit is applied, is a twin memory cell controlled by one word gate and two control gates.

4. A booster circuit in accordance with claim 2, wherein each of the non-volatile memory elements in the non-volatile semiconductor memory device, for which the booster circuit is applied, has an ONO membrane that includes an oxide film (O), a nitride film (N), and an oxide film (O) and functions as a trap site of electric charges.

5. A voltage generation circuit used for the non-volatile semiconductor memory device, the voltage generation circuit comprising:

a booster circuit in accordance with claim 2; and a control voltage generation circuit that receives the boosted voltage output from the booster circuit and generates a control voltage, which is used to implement a specific operation with regard to each of the non-volatile memory elements according to the operation mode.

6. A non-volatile semiconductor memory device comprising a booster circuit in accordance with claim 2.

7. A booster circuit in accordance with claim 1, wherein the oscillation circuit generates a signal of varying frequency with time as the clock signal during at least the rising time period.

8. A booster circuit in accordance with claim 7, wherein each of the non-volatile memory elements in the non-volatile semiconductor memory device, for which the booster circuit is applied, is a twin memory cell controlled by one word gate and two control gates.

9. A booster circuit in accordance with claim 7, wherein each of the non-volatile memory elements in the non-volatile semiconductor memory device, for which the booster circuit is applied, has an ONO membrane that includes an oxide film (O), a nitride film (N), and an oxide film (O) and functions as a trap site of electric charges.

10. A voltage generation circuit used for the non-volatile semiconductor memory device, the voltage generation circuit comprising:

a booster circuit in accordance with claim 7; and a control voltage generation circuit that receives the boosted voltage output from the booster circuit and generates a control voltage, which is used to implement a specific operation with regard to each of the non-volatile memory elements according to the operation mode.

11. A non-volatile semiconductor memory device comprising a booster circuit in accordance with claim 7.

12. A booster circuit in accordance with claim 1, wherein each of the non-volatile memory elements in the non-volatile semiconductor memory device, for which the booster circuit is applied, is a twin memory cell controlled by one word gate and two control gates.

13. A booster circuit in accordance with claim 1, wherein each of the non-volatile memory elements in the non-volatile semiconductor memory device, for which the booster circuit is applied, has an ONO membrane that includes an oxide film (O), a nitride film (N), and an oxide film (O) and functions as a trap site of electric charges.

14. A voltage generation circuit used for the non-volatile semiconductor memory device, the voltage generation circuit comprising:

a booster circuit in accordance with claim 1; and a control voltage generation circuit that receives the boosted voltage output from the booster circuit and generates a control voltage, which is used to implement a specific operation with regard to each of the non-volatile memory elements according to the operation mode.

15. A non-volatile semiconductor memory device comprising a booster circuit in accordance with claim 1.

* * * * *